(12) United States Patent
Grisenthwaite

(10) Patent No.: US 6,779,143 B2
(45) Date of Patent: Aug. 17, 2004

(54) ASYNCHRONOUS TESTING OF RESET OPERATION IN AN INTEGRATED CIRCUIT

(75) Inventor: Richard Roy Grisenthwaite, Royston (GB)

(73) Assignee: Arm Limited, Cambridge (GB)

( * ) Notice: Subject to any disclaimer, the term of this patent is extended or adjusted under 35 U.S.C. 154(b) by 460 days.

(21) Appl. No.: 09/898,462

(22) Filed: Jul. 5, 2001

(65) Prior Publication Data

US 2002/0083389 A1 Jun. 27, 2002

(30) Foreign Application Priority Data

Dec. 22, 2000 (GB) .............................. 0031554

(51) Int. Cl.⁷ .............................................. G01R 31/28
(52) U.S. Cl. ..................................................... 714/727
(58) Field of Search ............................... 714/726, 727, 714/729; 709/222

(56) References Cited

U.S. PATENT DOCUMENTS

| | | | | |
|---|---|---|---|---|
| 4,649,539 A | * | 3/1987 | Crain et al. .................. | 714/731 |
| 5,260,950 A | * | 11/1993 | Simpson et al. ............. | 714/727 |
| 5,285,153 A | * | 2/1994 | Ahanin et al. .............. | 324/73.1 |
| 5,416,784 A | * | 5/1995 | Johnson ....................... | 714/733 |
| 5,497,378 A | * | 3/1996 | Amini et al. ................ | 714/727 |
| 5,574,731 A | * | 11/1996 | Qureshi ....................... | 714/726 |
| 6,321,354 B1 | * | 11/2001 | Prunier ........................ | 714/726 |
| 6,400,196 B1 | * | 6/2002 | Aoki et al. .................. | 327/143 |

FOREIGN PATENT DOCUMENTS

| EP | 0 846 956 | | 6/1998 |
|---|---|---|---|
| GB | 0 846 956 A | * | 12/2000 |

* cited by examiner

*Primary Examiner*—Albert Decady
*Assistant Examiner*—John P Trimmings
(74) *Attorney, Agent, or Firm*—Nixon & Vanderhye P.C.

(57) ABSTRACT

An integrated circuit (2) is provided with a serial test scan chain (10) for testing proper operation. Asynchronous reset signal operation may be tested by using a reset signal generating scan chain cell (20) that is adapted such that a reset signal value held within a latch (14) of that cell is asynchronously gated to be applied to the circuit portion (8) under test by the scan enable signal. The latches (12) within the circuit portion under test that are forced to predetermine values by the correct operation of the reset may be preloaded with opposite sense values prior to the reset test.

10 Claims, 7 Drawing Sheets

Reset Scan Cell

ASYNCHRONOUS TESTING OF RESET OPERATION IN AN INTEGRATED CIRCUIT

BACKGROUND OF THE INVENTION

1. Field of the Invention

This invention relates to the field of integrated circuit testing. More particularly, this invention relates to the testing of the reset function of integrated circuits.

2. Description of the Prior Art

It is important to test integrated circuits for proper operation once they have been manufactured. As integrated circuits increase in complexity, the extent of the tests that need to be performed to properly check a sufficient degree of the functionality of the integrated circuit increase markedly. These problems are compounded with the move towards system-on-chip designs whereby multiple functional units, possibly designed and provided by different sources, are combined upon a single integrated circuit. The number of available input and output pins provided by an integrated circuit package limits the access that may be made to points within the integrated circuit package for testing purposes.

One way of enhancing the ability to test integrated circuits is to use serial test scan chains, such as those proposed in the IEEE JTAG Standard. Serial test scan chains may be used to scan in test vectors to points deep within an integrated circuit, apply those test vectors and collect result values that may then be analysed to confirm correct operation. Whilst the scan chain approach has significant advantages, and is well suited to system-on-chip designs where different portions can be provided with their own serial test scan chains, it suffers from a difficulty in trying to test proper reset operation.

Serial test scan chain techniques scan in data, apply data and capture data in synchronism with a controlling clock signal. This synchronous type of test operation is reasonably well suited to testing what will be synchronous type normal operation. However, a problem exists in trying to test what are normally asynchronous types of operation of the integrated circuit. A highly significant example of such an asynchronous type of operation is the response to an asynchronous reset signal. It is common that circuit portions within an integrated circuit are responsive to an asynchronously applied reset signal to reinitialise their state. Incorrect reset operation is a significant fault in an integrated circuit and it is important that asynchronous reset operation should be properly tested. One way of achieving this is to route out a reset pin for each circuit portion so that this may be used to test the reset operation of that circuit portion. However, as previously mentioned, the number of pins provided by an integrated circuit package is a frequent limiting factor in system design and allocating these valuable input/output pins for manufacturing test operations is undesirable. Furthermore, with the increased use of system-on-chip designs employing multiple circuit portions/macrocells from different sources that may each be subject to their own reset signal, this approach may lead to the need to express multiple external reset pins on the circuit package purely for manufacturing test purposes.

SUMMARY OF THE INVENTION

Viewed from one aspect the present invention provides an integrated circuit comprising:

(i) a circuit portion having at least one circuit portion latch operable to store a signal value that is reset to a predetermined reset value upon receipt of a reset signal by said circuit portion; and (ii) one or more serial test scan chains each having a plurality of scan chain cells, at least one of said serial test scan chain being operable to store and apply test signals to said circuit portion as part of testing for correct operation of said circuit portion, said test signals being applied to said circuit portion under control of a scan enable signal and synchronously with a clock signal; wherein (iii) said serial test scan chain includes a reset signal generating scan chain cell operable when storing a predetermined reset signal value to generate said reset signal under control of said scan enable signal and independently of and asynchronous with said clock signal.

The invention recognises that whilst the scan enable signal and the clock signal normally act synchronously to apply test signals, the scan enable can be used in conjunction with a modified scan chain cell for generating the reset signal to generate that reset signal at a time asynchronous with the clock signal and thus check the asynchronous reset operation of the circuit portion under test. The system may contain one or more scan chains (typically more, but a small design may have a single scan chain).

Whilst it will be appreciated that the circuit portion for which the reset operation is tested could take many different forms, and could be the whole of the integrated circuit, the invention is particularly useful when the circuit portion under reset test is a macrocell circuit portion. Such macrocell circuit portions often have their own specific reset operation that requires proper testing. The testing of reset operation is particularly valuable when the macrocell is a microprocessor as the microprocessor is a circuit element that may reasonably be expected to require reset operation due to system crashes.

In the context of system-on-chip designs where the invention is particularly valuable, the serial test scan chain may be conveniently provided in the form of a boundary test scan chain surrounding the circuit portion. The circuit portion and its associated boundary test scan chain will often be sourced from a particular provider and accordingly encapsulating the reset test mechanisms within this provided element is highly convenient.

The scan chain cells may contain storage latches that are updated at a fixed point within the cycle of the clock signal. This provides the normal synchronous type of operation of the scan chain testing. In a particularly preferred embodiment of the reset signal generating scan chain cell, the storage latch within that cell is arranged to store a signal whose value is also gated by gate logic controlled by the scan enable signal. Thus, the signal value required to generate a reset signal may be loaded into the reset signal generating scan chain cell, but be prevented from application to the circuit portion until it is released by an appropriate change in the scan enable signal. The scan enable signal can be controlled asynchronously with the clock signal to release the reset signal to the circuit portion in an asynchronous fashion to the clock signal and accordingly provide improved testing of the reset operation.

Viewed from another aspect the present invention provides a method of testing reset operation of an integrated circuit, said integrated circuit having a circuit portion including at least one circuit portion latch operable to store a signal value that is reset to a predetermined reset value upon receipt of a reset signal by said circuit portion, and one or more serial test scan chains each having a plurality of scan chain cells, at least one of said serial test scan chains being operable to store and apply test signals to said circuit portion as part of testing for correct operation of said circuit portion, said test signals being applied to said circuit portion under control of a scan enable signal and synchronously with a clock signal, said method comprising the steps of:

(i) storing a predetermined reset signal value in a reset signal generating scan chain cell within said serial test scan chain; and (ii) generating said reset signal from said predetermined reset signal value under control of said scan enable signal and independently of and asynchronous with said clock signal.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
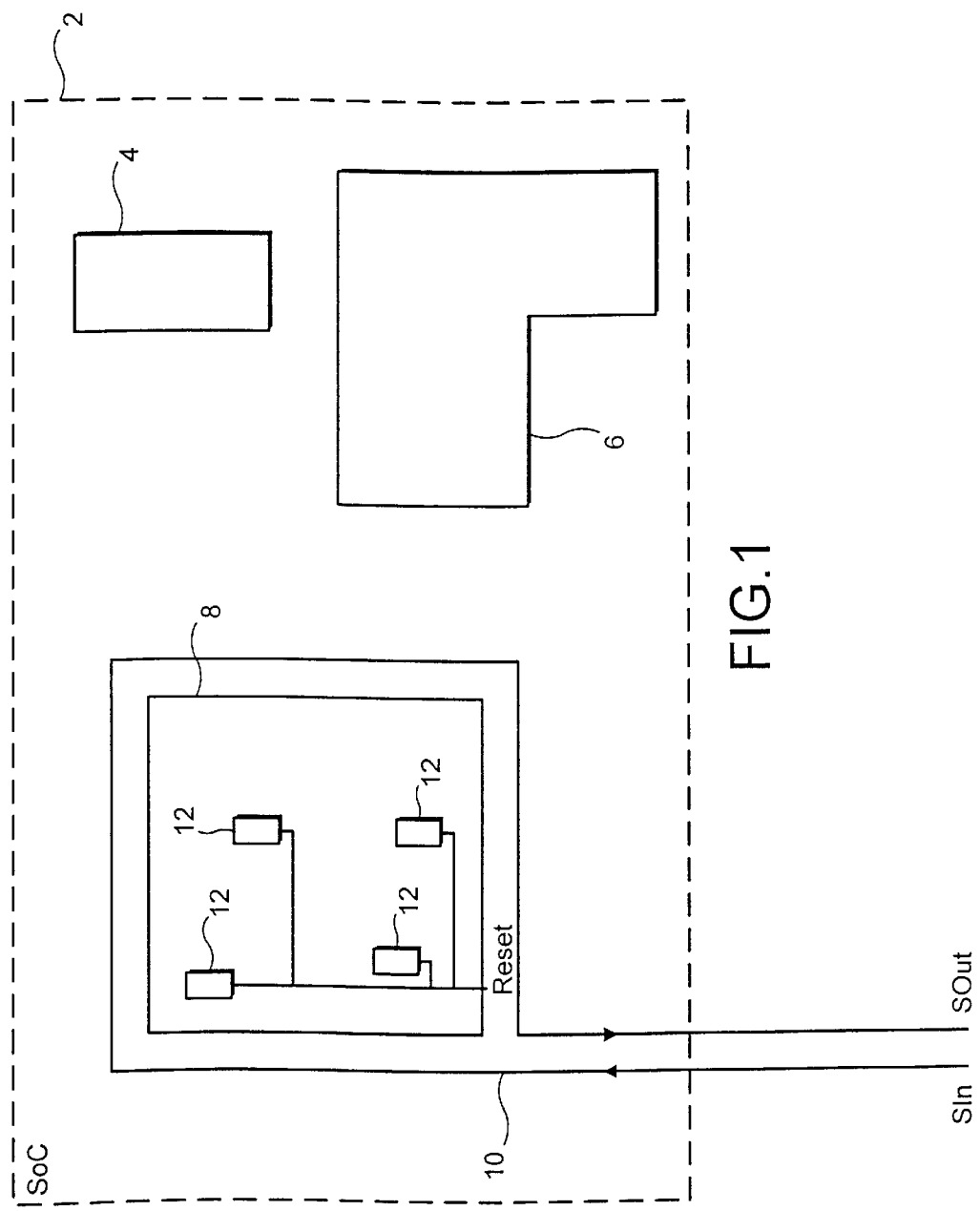
FIG. 1 schematically illustrates a system-on-chip design containing a plurality of macrocells.

FIG. 1 illustrates an integrated circuit 2 including a plurality of macrocells 4, 6, 8. Each of these macrocells may provide different functionality of the integrated circuit 2 and may be designed and supported by a different provider. The macrocell 8 is a microprocessor core and is surrounded by a boundary scan cell chain 10. Within the microprocessor core 8 there are a plurality of latches 12 that store signal values that are forced to a predetermined reset signal value during normal, correct operation of a reset signal. By forcing each of these latches to this predetermined reset signal state, the microprocessor 8 can be placed in a known reset state from which processing can safely recommence. The reset signal in normal operation may be provided asynchronously to any of the other signals controlling the operation of integrated circuit 2 and accordingly it is important that the correct operation of the reset signal should also be tested asynchronously. Once the reset signal has been asynchronously applied during test, the signal values stored in the latches 12 can be scanned out to check for correct operation.

The boundary scan cell chain 10 is formed of a plurality of serially connected scan chain cells, which may be controlled in accordance with the IEEE JTAG Standard, arranged around the periphery of the microprocessor 8. The scan chain cells are used to apply test signals to and capture result signals from the microprocessor 8.

Figure 2:
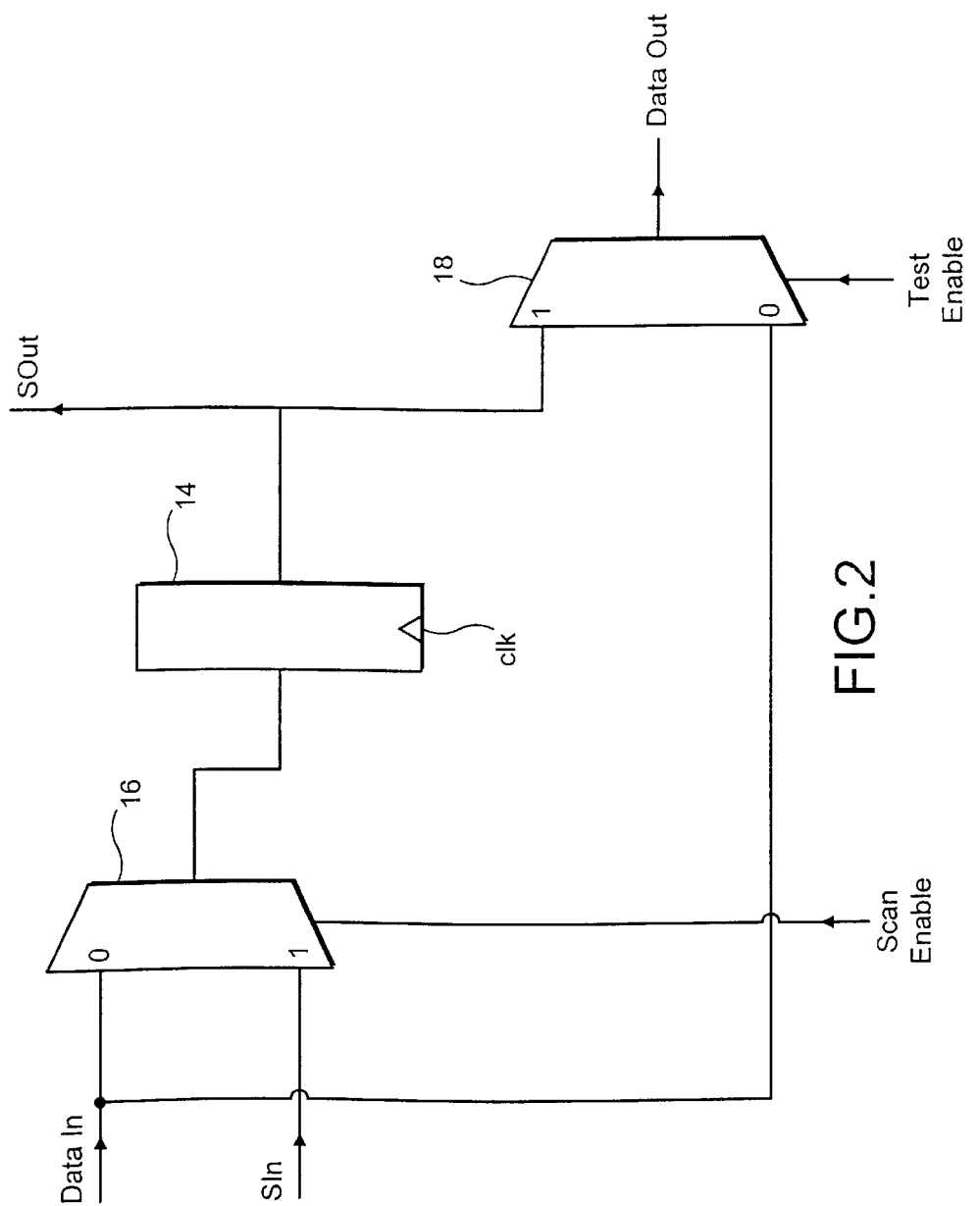
FIG. 2 illustrates a boundary scan cell.

FIG. 2 illustrates one possible form of a standard boundary scan cell. A latch 14 is provided within the scan chain cell and may be used to either store a value to be applied to the circuit portion under test or to capture a value from the circuit portion under test. When it is desired to serially shift signal values into the scan cell chain or recover them from the scan cell chain, the scan enable signal is used to switch a multiplexer 16 to serially interconnect the scan chain cells. The latch 14 is arranged to update its value upon the rising edge of an applied clock signal to the latch 14. Accordingly, at each rising edge of the clock signal, the signal values held within respective latches 14 advance by one position into and out of the scan cell chain as a whole. A further multiplexer 18 is provided to bypass the scan cell as a whole when not in test operation, and is controlled by a test enable signal.

Figure 3:
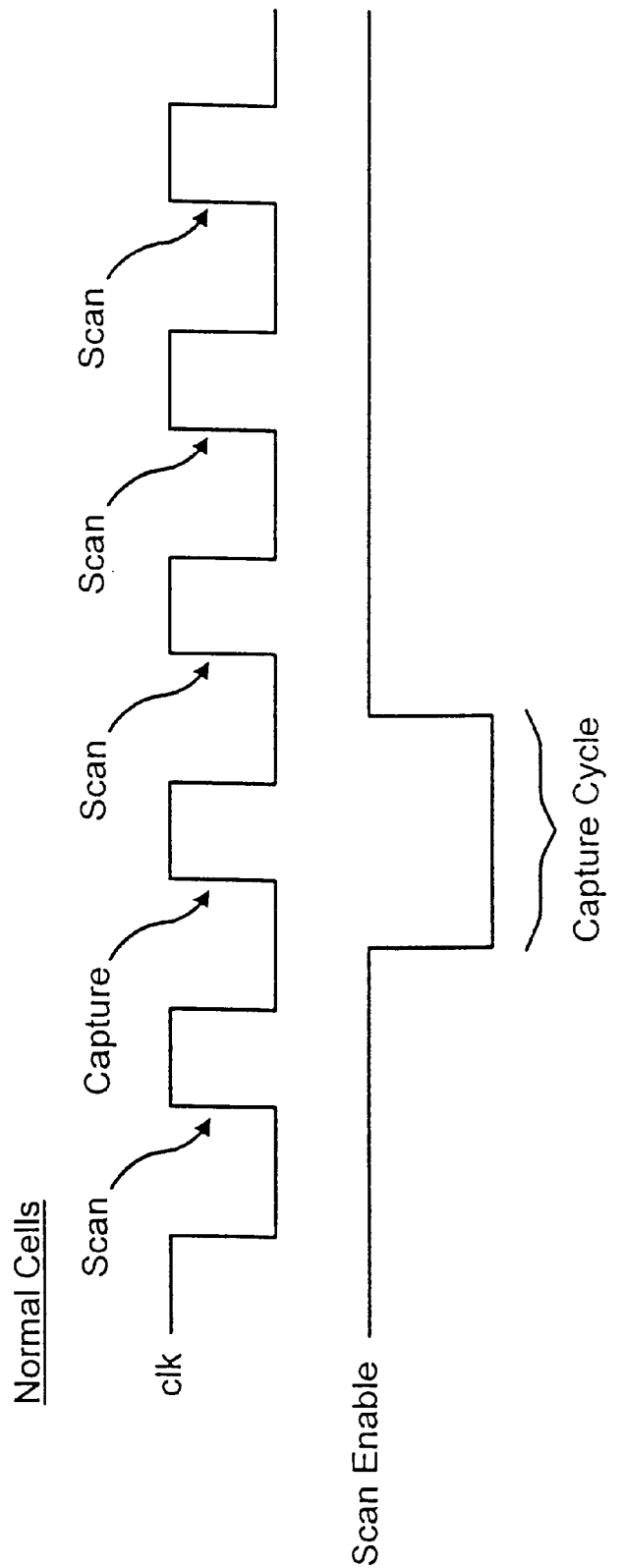
FIG. 3 illustrates the clock signal and scan enable signal used to control the boundary scan cell of FIG. 2.

FIG. 3 is a signal diagram illustrating the operation of the circuit of FIG. 2. The latch 14 is updated at each rising edge of the clock signal. When the scan enable signal is high, the rising edge of the clock signal will trigger a serial shift through the scan cell chain. When the scan enable signal is low, then the rising edge of the clock signal will trigger a signal value to be captured from the circuit portion under test when the cell is one dedicated to signal capture. When new signal values are stored within the latch 14 in synchronism with the clock signal, they are applied to the circuit portion under test.

Figure 4:
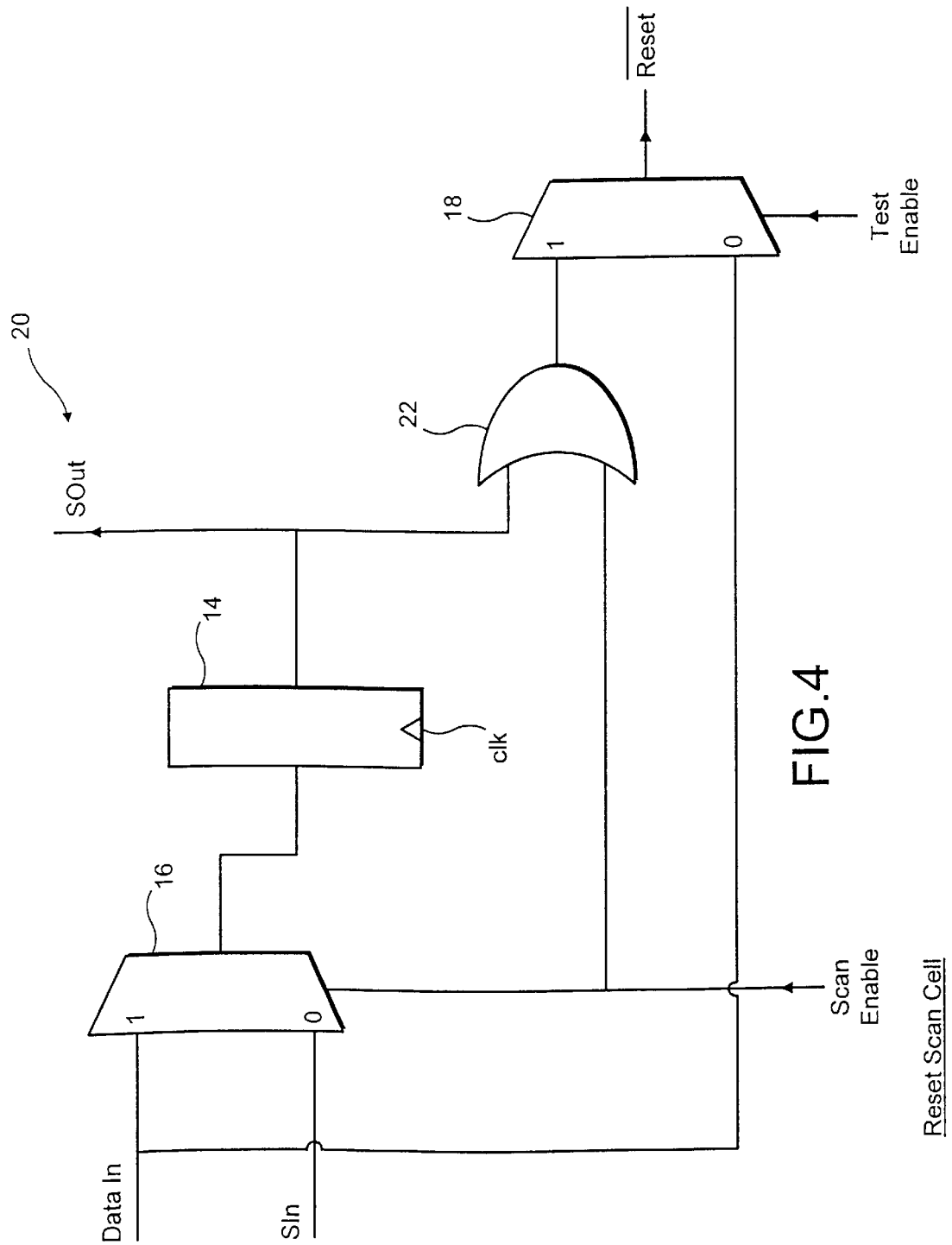
FIG. 4 illustrates a reset signal generating scan chain cell.

FIG. 4 illustrates a reset signal generating scan chain cell 20. This reset signal generating scan chain cell 20 is modified from that illustrated in FIG. 2 by the inclusion of an OR-gate 22. The OR-gate 22 serves to gate the signal stored within the latch 14 from either being applied as a reset signal or not applied as a reset signal using the scan enable value. The reset signal generated by the reset signal generating scan chain cell 20 is active when low and accordingly if the scan enabled signal is high, then the action of the OR-gate 22 will be to hold the reset signal as inactive irrespective of what signal value is stored within the latch 14.

Figure 5:
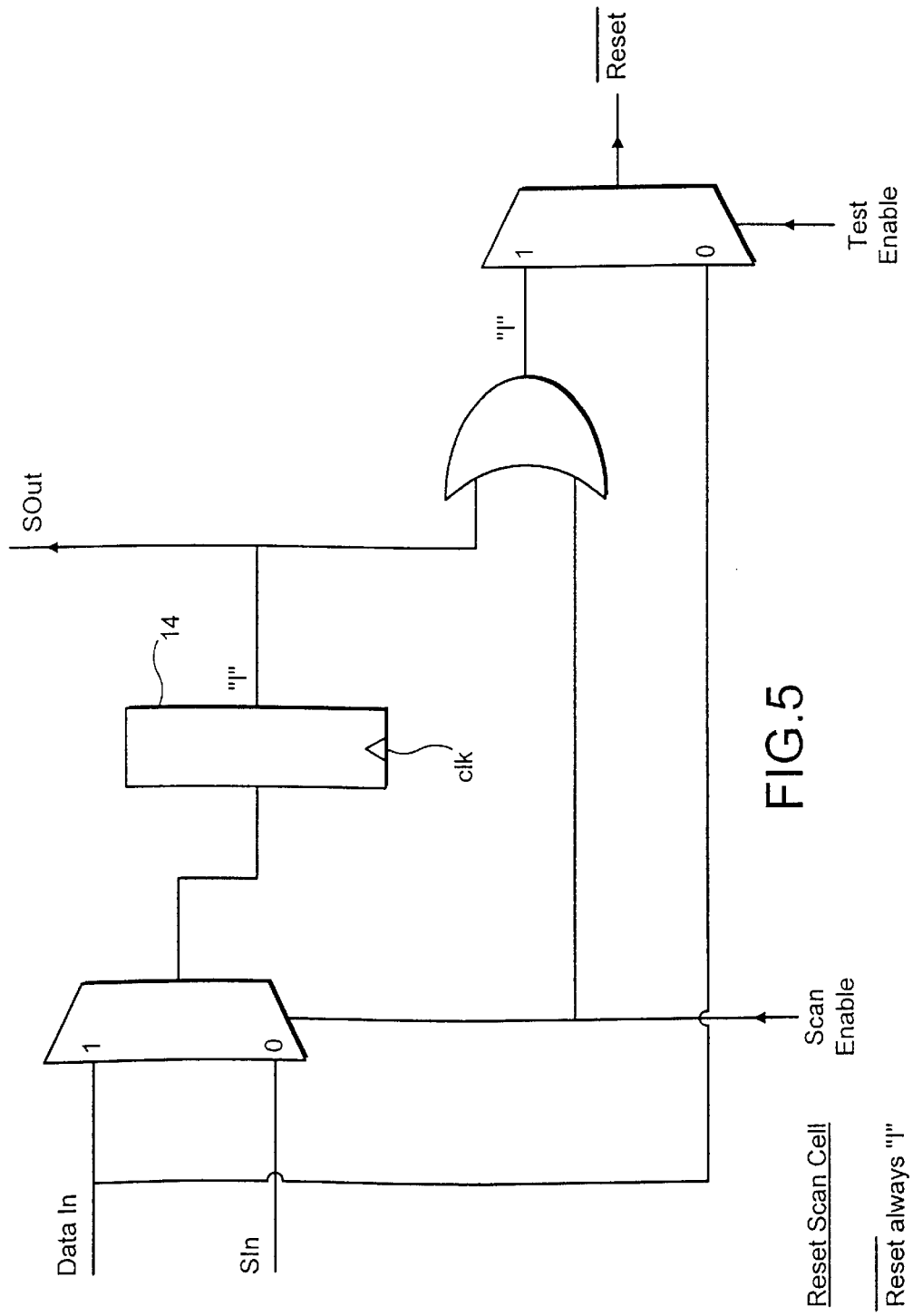
FIGS. 5 and 6 schematically illustrate the operation of the circuit of FIG. 4.

Referring to FIG. 5, when it is desired not to test the reset operation, then a high value may be stored within the latch 14 and thus the reset signal held inactive irrespective of the value of the scan enable signal.

Figure 6:
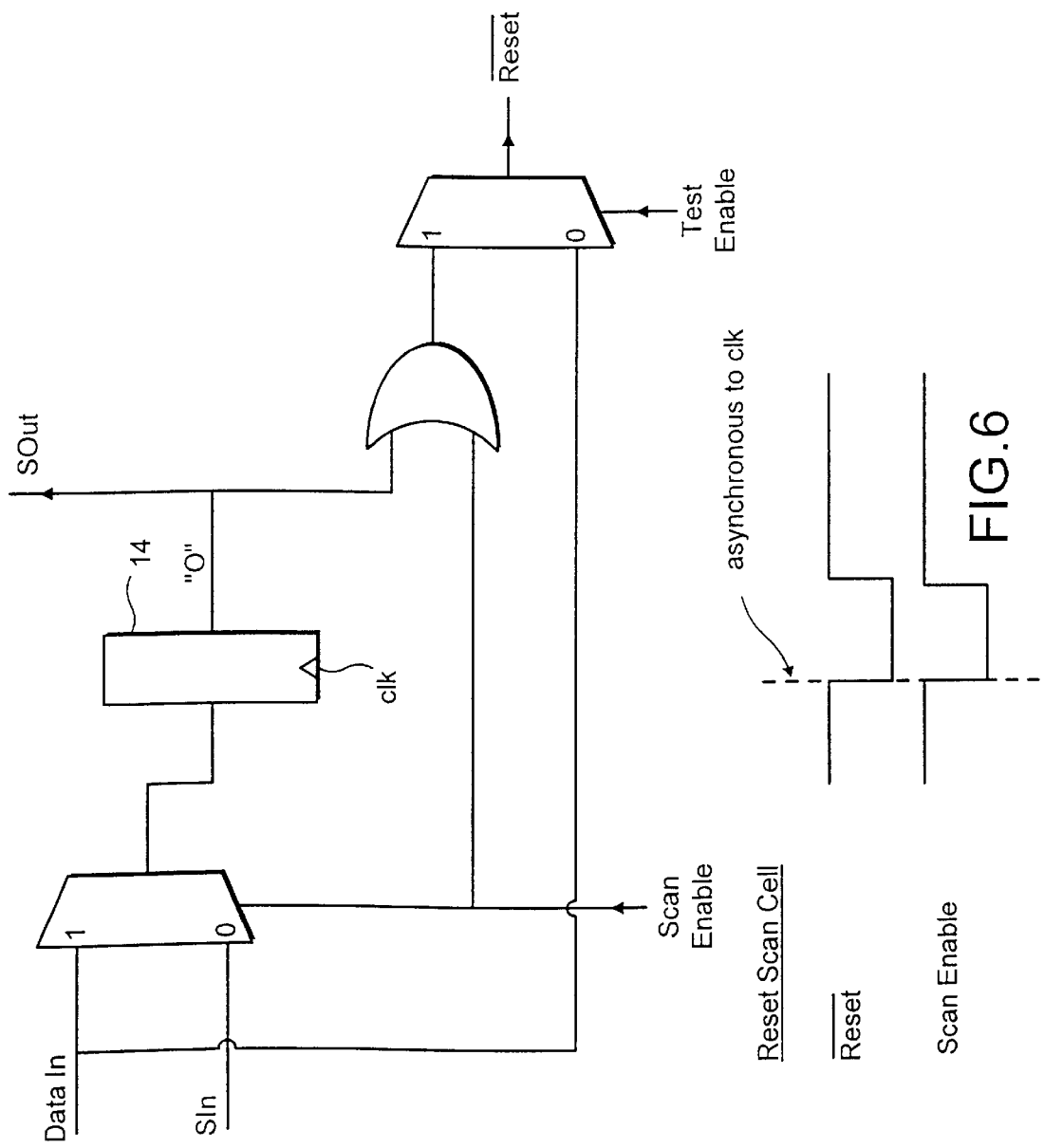

As shown in FIG. 6, when it is desired to test the asynchronous generation of the reset signal, then this is set up by first loading a low signal value into the latch 14. This low signal value is prevented from being expressed at the output of the reset signal generating scan chain cell 20 until the scan enable signal also goes low. The scan enable signal may be driven low independently of the current state of the clock signal and accordingly the active reset signal released to the circuit portion under test in an asynchronous manner as desired.

Figure 7:
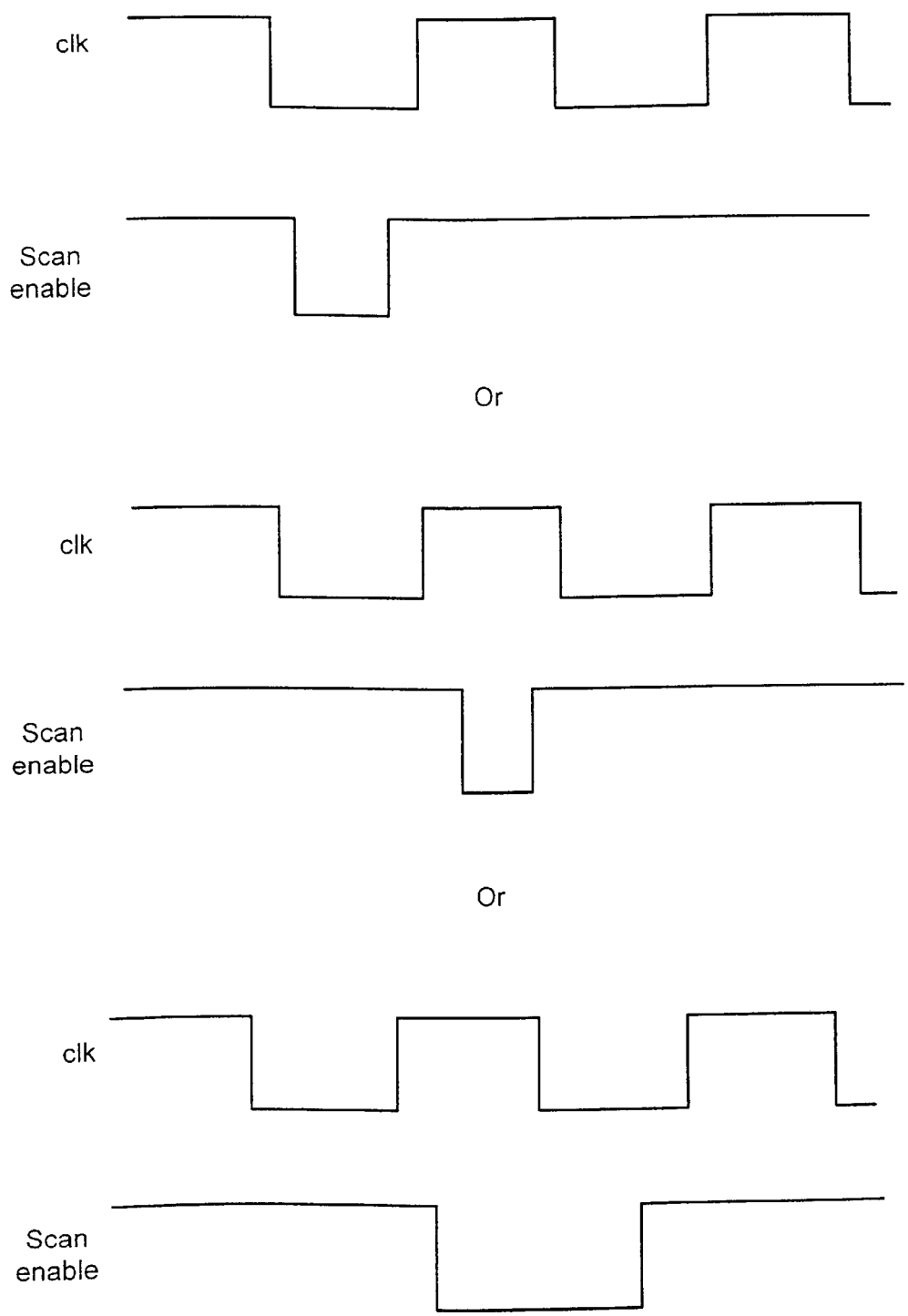
FIG. 7 schematically illustrates different possible relationships between the scan enable signal and the clock signal when testing asynchronous reset.

In order to thoroughly test the asynchronous nature of the reset, the low time of the Scan Enable signal explicitly must not encompass a clock signal CLK rising edge, as shown in FIG. 7.

Returning to FIG. 1, in order to thoroughly test the reset operation, each of the latches 12 that is forced to a predetermined reset value by application of a reset signal may be preloaded with a signal value opposite to its predetermined reset signal value prior to testing the reset signal. These set up values may be loaded into the latches 12 via an associated scan cell chain. When all of the latches 12 are appropriately loaded, then the asynchronous reset signal may be released and each of the latches 12 should undergo a signal transition if the reset operation is performing correctly. The correct operation of this asynchronous reset may be verified by capturing and scanning out the new values within the latches 12 and the other state indicative values from around the microprocessor 8.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. An integrated circuit comprising:
   (i) a circuit portion having at least one circuit portion latch operable to store a signal value that is reset to a predetermined reset value upon receipt of a reset signal by said circuit portion; and
   (ii) one or more serial test scan chains each having a plurality of scan chain cells, at least one of said serial test scan chains being operable to store and apply test signals to said circuit portion as part of testing for correct operation of said circuit portion, said test signals being applied to said circuit portion under control of a scan enable signal and synchronously with a clock signal; wherein
   (iii) said serial test scan chain includes a reset signal generating scan chain cell operable when storing a predetermined reset signal value to generate said reset signal under control of said scan enable signal and independently of and asynchronous with said clock signal.

2. An integrated circuit as claimed in claim 1, wherein said circuit portion is a macrocell circuit portion.

3. An integrated circuit as claimed in claim 2, wherein said circuit portion is a microprocessor macrocell.

4. An integrated circuit as claimed in claim 1, wherein said serial test scan chain is a boundary test scan chain surrounding said circuit portion.

5. An integrated circuit as claimed in claim 1, wherein said serial test scan chain applies test signal to said circuit portion and captures response signals from said circuit portion.

6. An integrated circuit as claimed in claim 1, wherein said scan chain cells include a signal storage latch that is updated at a fixed point within a signal cycle of said clock signal.

7. An integrated circuit as claimed in claim 1, wherein said reset signal generating scan chain cell includes a reset signal storage latch that is updated at a fixed point within a signal cycle of said clock signal.

8. An integrated circuit as claimed in claim 7, wherein said reset signal generating scan chain cell includes a gate circuit operable to gate said reset signal generated from said reset signal storage latch with said scan enable signal.

9. An integrated circuit as claimed in claim 1, wherein each circuit portion latch is loaded with signal value different to said predetermined reset value prior to generating said reset signal.

10. A method of testing reset operation of an integrated circuit, said integrated circuit having a circuit portion including at least one circuit portion latch operable to store a signal value that is reset to a predetermined reset value upon receipt of a reset signal by said circuit portion, and one or more serial test scan chains each having a plurality of scan chain cells, at least one of said serial test scan chains being operable to store and apply test signals to said circuit portion as part of testing for correct operation of said circuit portion, said test signals being applied to said circuit portion under control of a scan enable signal and synchronously with a clock signal, said method comprising the steps of:
   (i) storing a predetermined reset signal value in a reset signal generating scan chain cell within said serial test scan chain; and
   (ii) generating said reset signal From said predetermined reset signal value under control of said scan enable signal and independently of and asynchronous with said clock signal.

* * * * *